United States Patent
Pomaranski et al.

(10) Patent No.: US 7,493,534 B2
(45) Date of Patent: Feb. 17, 2009

(54) MEMORY ERROR RANKING

(75) Inventors: Ken Gary Pomaranski, Roseville, CA (US); Andy Harvey Barr, Roseville, CA (US); Dale John Shidla, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 903 days.

(21) Appl. No.: 10/652,098

(22) Filed: Aug. 29, 2003

(65) Prior Publication Data

US 2005/0050410 A1 Mar. 3, 2005

(51) Int. Cl.
*G11C 29/00* (2006.01)
*G11C 7/00* (2006.01)

(52) U.S. Cl. ...................... 714/723; 365/201
(58) Field of Classification Search ............... 438/14; 716/21; 714/718, 720, 723; 365/201
See application file for complete search history.

(56) References Cited

U.S. PATENT DOCUMENTS

| | | | | |
|---|---|---|---|---|
| 4,584,681 A * | 4/1986 | Singh et al. | ..................... | 714/7 |
| 4,628,509 A * | 12/1986 | Kawaguchi | .................. | 714/711 |
| 5,287,500 A | 2/1994 | Stoppani, Jr. | | |
| 5,500,940 A | 3/1996 | Skeie | | |
| 5,550,838 A * | 8/1996 | Okajima | ..................... | 714/719 |
| 5,790,886 A | 8/1998 | Allen | | |
| 5,867,642 A | 2/1999 | Vivio et al. | | |
| 5,907,854 A | 5/1999 | Kerns | | |
| 6,096,093 A * | 8/2000 | Caywood et al. | ............... | 716/21 |
| 6,130,442 A * | 10/2000 | Di Zenzo et al. | .............. | 257/48 |
| 6,212,647 B1 | 4/2001 | Sims et al. | | |
| 6,265,232 B1 * | 7/2001 | Simmons | ..................... | 438/14 |
| 6,330,621 B1 | 12/2001 | Bakke et al. | | |
| 6,360,340 B1 * | 3/2002 | Brown et al. | ................. | 714/718 |
| 6,441,897 B1 * | 8/2002 | Zeimantz | .................. | 356/237.4 |
| 6,446,224 B1 * | 9/2002 | Chang et al. | ................... | 714/54 |
| 6,553,533 B2 * | 4/2003 | Demura et al. | .............. | 714/769 |
| 6,622,270 B2 * | 9/2003 | Beffa | .......................... | 714/718 |
| 6,813,740 B1 * | 11/2004 | Lejeune | ..................... | 714/736 |
| 6,829,554 B2 * | 12/2004 | Dueregger et al. | .......... | 702/130 |
| 6,931,509 B2 | 8/2005 | Lloyd-Jones | | |
| 6,993,678 B2 | 1/2006 | Cheok et al. | | |
| 7,168,010 B2 * | 1/2007 | Yadavalli et al. | .............. | 714/42 |
| 2001/0020254 A1 | 9/2001 | Blumenau et al. | | |
| 2001/0036306 A1 * | 11/2001 | Wienecke | .................... | 382/149 |
| 2001/0052102 A1 * | 12/2001 | Roohparvar | ................ | 714/773 |
| 2002/0066056 A1 * | 5/2002 | Suzuki et al. | ............... | 714/720 |

(Continued)

FOREIGN PATENT DOCUMENTS

EP 283564 A2 * 9/1988

OTHER PUBLICATIONS

"Circuit complexity reduction for symbolic analysis of analog integrated circuits" by Daems et al. This paper appears in: Proceedings of 36th Design Automation Conference, Publication Date: 1999 On pp. 958-963 ISBN: 1-58113-092-9 INSPEC Accession No. 6504326.*

(Continued)

*Primary Examiner*—Cynthia Britt

(57) ABSTRACT

An example memory error ranking system is provided. The system may include an error detector logic that detects memory errors and a ranking logic that ranks the quality of a memory location based on memory errors detected by the error detector logic.

29 Claims, 7 Drawing Sheets

U.S. PATENT DOCUMENTS

| | | | |
|---|---|---|---|
| 2002/0087913 A1 | 7/2002 | Harper et al. | |
| 2002/0099996 A1* | 7/2002 | Demura et al. | 714/769 |
| 2002/0116651 A1 | 8/2002 | Beckert et al. | |
| 2003/0023811 A1 | 1/2003 | Kim et al. | |
| 2003/0088737 A1 | 5/2003 | Burton | |
| 2004/0030957 A1* | 2/2004 | Yadavalli et al. | 714/30 |
| 2004/0225946 A1* | 11/2004 | Hashimoto et al. | 714/764 |
| 2004/0243692 A1 | 12/2004 | Arnold et al. | |
| 2005/0033935 A1 | 2/2005 | Manbert et al. | |
| 2005/0097406 A1 | 5/2005 | Brebisson | |

OTHER PUBLICATIONS

U.S. Patent Office; Office Action for U.S. Appl. No. 10/827,946; dated Feb. 19, 2008.

U.S. Patent Office; Office Action for U.S. Appl. No. 10/827,946; dated Jun. 18, 2007.

U.S. Patent Office; Office Action for U.S. Appl. No. 10/827,946; dated Dec. 18, 2006.

U.S. Patent Office; Office Action for U.S. Appl. No. 10/827,946; dated May 2, 2006.

http://en.wikipedia.org/wiki/Interleaving.

* cited by examiner

MEMORY ERROR RANKING

TECHNICAL FIELD

The systems, methods, storage media, and so on described herein relate generally to managing electronic memory.

BACKGROUND

The amount of electronic memory in devices like computers, imaging devices, cellular telephones, and so on is increasing. The clock speeds at which electronic memory is accessed also continues to increase. Similarly, the range of temperatures at which electronic memory operates widens. The increased memory capacities, clock speeds, operating temperature ranges, and so on, may lead to additional memory errors. Conventionally, memory errors may have been handled in a binary fashion or not handled at all. For example, if a memory unit (e.g., memory page) experienced a memory error, the page may have been deallocated or the error may simply have been logged, presumably to be addressed by offline analyzers. These conventional techniques may have lead to risky online memory replacement that required physical access to operating memory chips or even riskier inattention to memory problems.

BRIEF DESCRIPTION OF THE DRAWINGS

The accompanying drawings, which are incorporated in and constitute a part of the specification, illustrate various example systems, methods, and so on that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
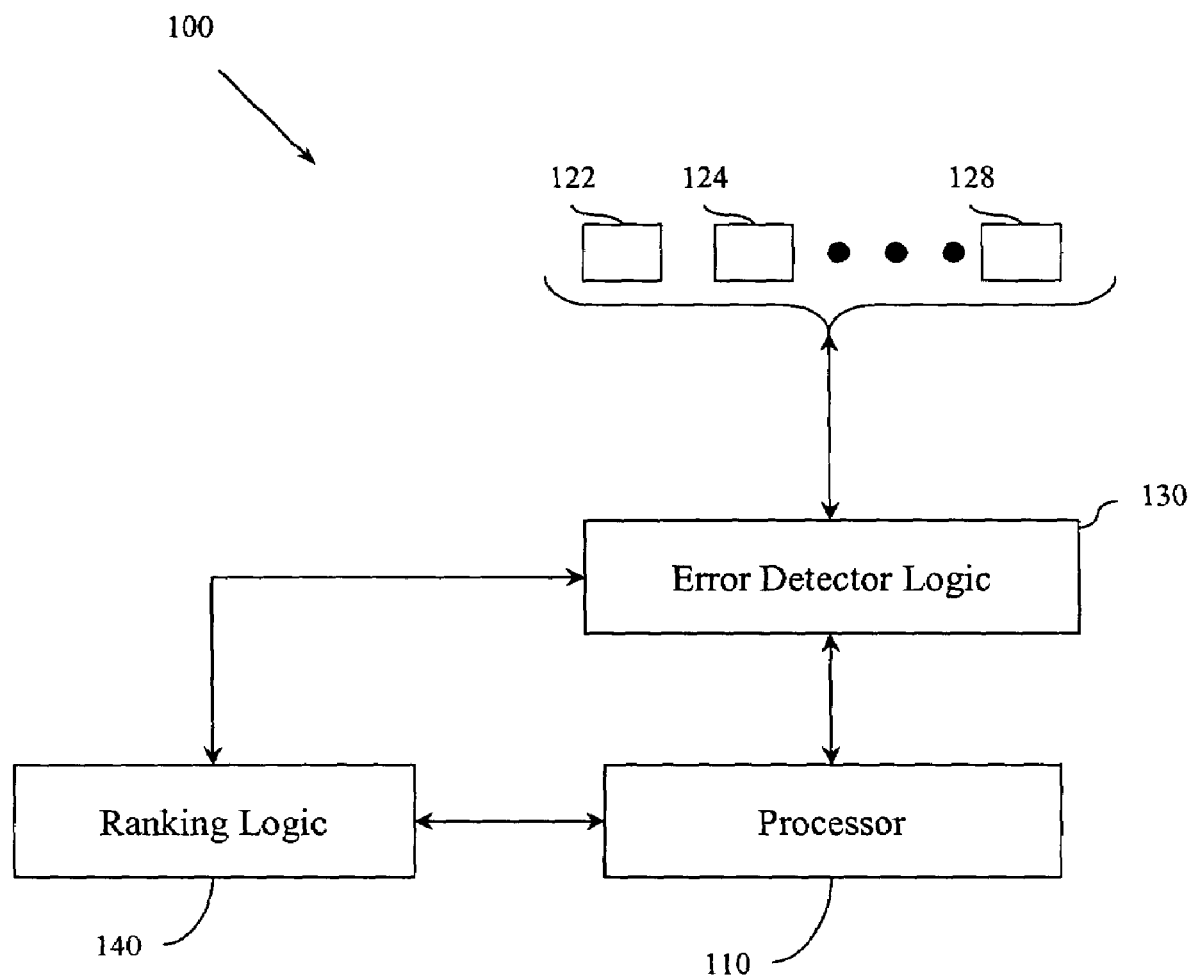
FIG. 1 illustrates an example memory error ranking system.

This application describes example systems, methods, computer-readable mediums and so on associated with ranking memory errors. The ranking facilitates determining the severity of a memory error and making run time trade offs of performance versus the likelihood of system failure while considering the effects of system downtime. In one example, substantially all the memory of a system is exercised and the severity of memory errors encountered during the exercising is tracked in a non-volatile memory. The non-volatile memory can then be examined to facilitate determining whether a memory location should be subjected to real-time, on-line actions like being deallocated, being retired, being reclaimed, and so on. Conventionally, some memory areas may have been "off limits" because a critical application had the memory locked. This reduced the value of such conventional memory checking routines. Therefore, example systems and methods described herein facilitate checking substantially all memory, including locked memory, available to a processor associated with an example system or method.

The following includes definitions of selected terms employed herein. The definitions include various examples and/or forms of components that fall within the scope of a term and that may be used for implementation. The examples are not intended to be limiting. Both singular and plural forms of terms may be within the definitions.

"Computer-readable medium", as used herein, refers to a medium that participates in directly or indirectly providing signals, instructions and/or data. A computer-readable medium may take forms, including, but not limited to, non-volatile media, and volatile media. Non-volatile media may include, for example, optical or magnetic disks and so on. Volatile media may include, for example, optical or magnetic disks, dynamic memory and so on. Common forms of a computer-readable medium include, but are not limited to, an application specific integrated circuit (ASIC), a compact disc (CD), a digital versatile disk (DVD), a random access memory (RAM), a read only memory (ROM), a programmable read only memory (PROM), an electronically erasable programmable read only memory (EEPROM), a disk, a memory stick, a floppy disk, a flexible disk, a hard disk, a magnetic tape, other magnetic medium, a CD-ROM, other optical medium, punch cards, paper tape, other physical medium with patterns of holes, an EPROM, a FLASH-EPROM, or other memory chip or card, and other media from which a computer, a processor or other electronic device can read.

"Logic", as used herein, includes but is not limited to hardware, firmware, software and/or combinations of each to perform a function(s) or an action(s), and/or to cause a function or action from another component. For example, based on a desired application or needs, logic may include a software controlled microprocessor, discrete logic like an ASIC, a programmed logic device, a memory device containing instructions, or the like. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

"Signal", as used herein, includes but is not limited to one or more electrical or optical signals, analog or digital, one or more computer or processor instructions, messages, a bit or bit stream, or other means that can be received, transmitted and/or detected.

"Software", as used herein, includes but is not limited to, one or more computer or processor instructions that can be read, interpreted, compiled, and/or executed and that cause a computer, processor, or other electronic device to perform functions, actions and/or behave in a desired manner. The instructions may be embodied in various forms like routines, algorithms, modules, methods, threads, and/or programs including separate applications or code from dynamically linked libraries. Software may also be implemented in a variety of executable and/or loadable forms including, but not limited to, a stand-alone program, a function call (local and/or remote), a servelet, an applet, instructions stored in a memory, part of an operating system or other types of executable instructions. It will be appreciated by one of ordinary skill in the art that the form of software may depend on, for example, requirements of a desired application, the environment in which it runs, and/or the desires of a designer/programmer or the like. It will also be appreciated that computer-readable and/or executable instructions can be located in one logic and/or distributed between two or more communicating, co-operating, and/or parallel processing logics and thus can be loaded and/or executed in serial, parallel, massively parallel and other manners.

Suitable software for implementing the various components of the example systems and methods described herein include programming languages and tools like Java, Pascal, C#, C++, C, CGI, Perl, SQL, APIs, SDKs, assembly, machine, firmware, microcode, and/or other languages and tools. Software, whether an entire system or a component of a system, may be embodied as an article of manufacture and maintained as part of a computer-readable medium as defined previously. Another form of the software may include signals that transmit program code of the software to a recipient over a network or other communication medium.

"Data store", as used herein, refers to a physical and/or logical entity that can store data. A data store may be, for example, a database, a table, a file, a list, a queue, a heap, a memory, a register, and so on. A data store may reside in one logical and/or physical entity and/or may be distributed between two or more logical and/or physical entities.

An "operable connection", or a connection by which entities are "operably connected", is one in which signals, physical communication flow, and/or logical communication flow may be sent and/or received. Typically, an operable connection includes a physical interface, an electrical interface, and/or a data interface, but it is to be noted that an operable connection may include differing combinations of these or other types of connections sufficient to allow operable control.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, displaying, or the like, refer to actions and processes of a computer system, logic, processor, or similar electronic device that manipulates and transforms data represented as physical (electronic) quantities.

FIG. 1 illustrates an example memory error ranking system 100. The system 100 may include a processor 110 that is operably connected to one or more memory locations (e.g., memory locations 122 through 128). The memory locations may be part of memory units like a memory page, a memory chip, a dual in line memory module (DIMM), a single in line memory module (SIMM), a RAM bus in line memory module (RLMM), a small outline DIMM (SODIMM), a RAM bus DRAM (RDRAM) and so on. When the processor 110 accesses a memory location via, for example, an input/output (i/o) operation like a memory read or memory write, the memory location may exhibit a memory error. Thus the system 100 may include an error detector logic 130 configured to detect a memory error associated with the memory location accessed by the processor 110. In one example, the processor 110 is programmed to access substantially all memory locations available to it to facilitate producing a quality rank for the memory locations.

The system 100 may also include a ranking logic 140 configured to rank the quality of memory locations based, at least in part, on memory errors detected by the error detector logic 130. Both present and historical errors may be evaluated. Thus, in one example, the ranking logic 140 ranks the quality of memory locations based on current memory errors associated with a memory location and/or past errors associated with the memory location over a selected time period. In one embodiment, the ranking logic 140 can be configured to generate a quality ranking based on a predefined range such as from 1 to 10 where a higher value represents a higher quality. Of course, other ranges and/or value scores can be used including numeric, character, alphanumeric, combinations of these and others.

For example, a first memory location may have experienced one correctable single bit error and thus may have a first quality ranking (e.g., 9 out of 10). A second memory location may have experienced, for example, several correctable single bit errors and thus may have a second lower quality ranking (e.g., 7 out of 10). A third memory location may have experienced, for example, a single uncorrectable multi-bit error and thus may have a third quality ranking (e.g., 4 out of 10) while a fourth memory location may have experienced a series of uncorrectable multi-bit errors and thus may have a low quality ranking (e.g., 1 out of 10). While a descending ten point scale is described it is to be appreciated that other scales can be employed.

Ranking the quality of memory locations facilitates taking various memory related actions based on the rankings. Thus, an example system 100 may also include a memory action logic (not illustrated) configured to perform memory related actions based on the quality ranking of a memory location. For example, the memory action logic might perform actions including, but not limited to, deallocating a unit of memory (e.g., page) associated with a memory location, reallocating a unit of memory associated with a memory location, reclaiming a unit of memory associated with a memory location, and generating a signal associated with a memory location. By way of illustration, if a memory location has a poor quality ranking that passes a selected quality threshold value, then the memory action logic may determine that that location should no longer be used. Thus, the memory action logic may deallocate that location by, for example, deallocating the page of memory associated with the unit of memory.

By way of further illustration, a memory location may, at a first point in time have been allocated to a first application based on its quality ranking. Over time, various quality rankings for various memory locations can be re-evaluated and analyzed. Then, at a second point in time, the system can reallocate the memory location to a second application based on its relative quality ranking as compared to other memory locations. Similarly, a memory location may have been deallocated based on its quality ranking. Over time, as various quality rankings for various memory locations are re-evaluated and analyzed, the system 100 may decide to reclaim the memory location based on its relative quality ranking as compared to other memory locations. Thus, the system 100 facilitates selectively taking memory configuration actions based on quality rankings. The system 100 can also facilitate distinguishing between correctable and uncorrectable errors and thus selectively taking configurable actions based on the correctable nature of an error.

Figure 2:
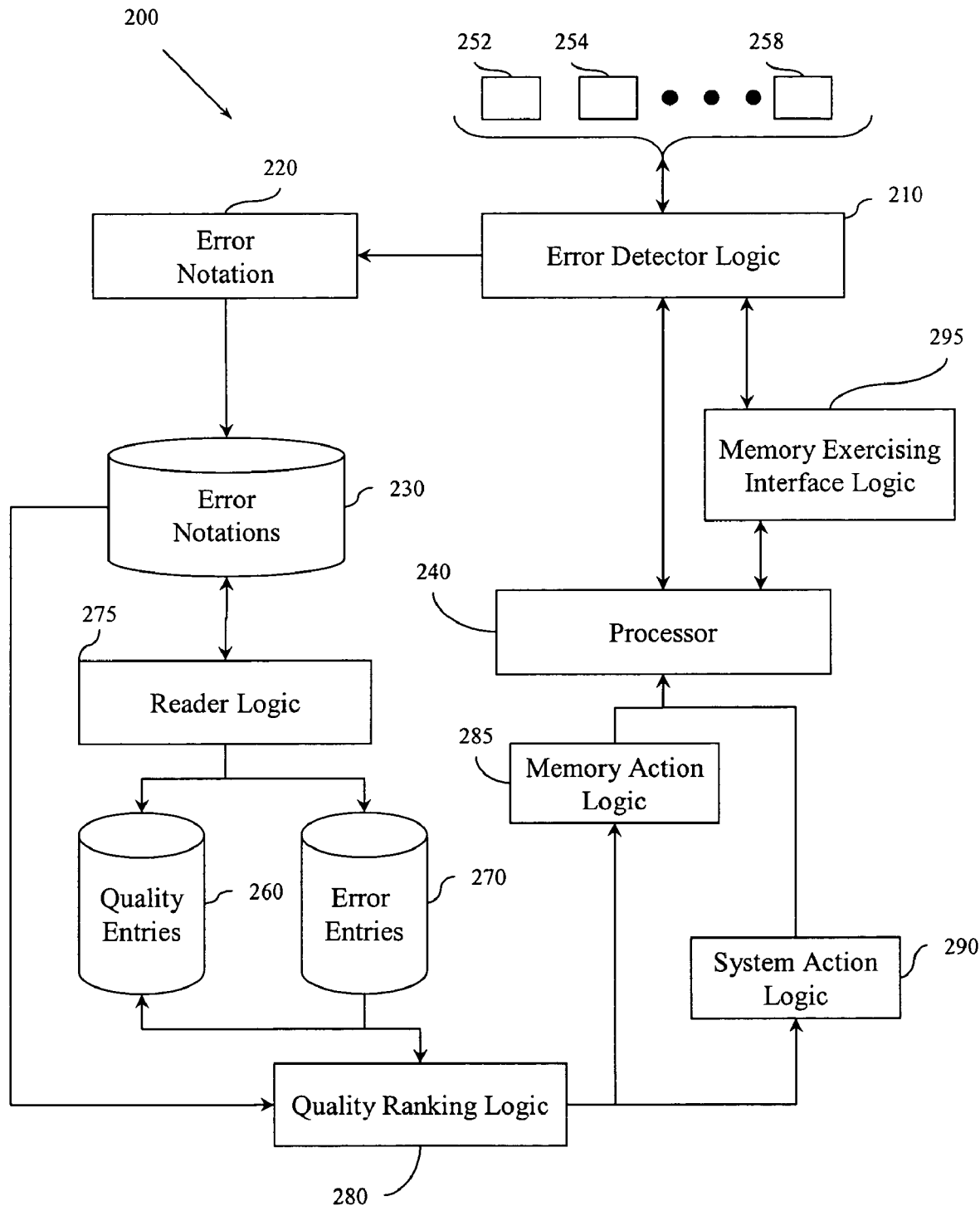
FIG. 2 illustrates an example memory error ranking system.

FIG. 2 illustrates an example memory error ranking system 200. The system 200 includes an error detector logic 210 that may be configured to detect memory errors. The error detector logic 210 may generate an error notation 220 that is stored in an error notation data store 230. The error detector logic 210 may be operably connected to a processor 240 that accesses various memory locations (e.g., memory locations 252 through 258). For example, the processor 240 may perform an i/o operation like a read or write to a memory location. The memory location may experience a memory error during the i/o operation. The error detector logic 210 can detect the error and store the error notation 220 that memorializes the error in the error notation data store 230. The error detector logic 210 can be physically located in various locations. In one example, the error detector logic 210 is located in a main memory interface while in another example the error detector logic 210 is located in a central processing unit.

In one example, the error notation data store 230 is a relatively small (e.g., 1K) volatile memory. The error notation 220 may include one or more parameters associated with an error, for example, a memory location identifier, a memory error type, and a memory error time. The memory location identifier may identify, for example, a page, a chip, a slot, a DIMM, a SIMM, and so on associated with the memory location. The error types detected by the error detector logic 210 can include, but are not limited to, a single bit error, a multi-bit error, and an address/control parity error.

The system 200 may also include a quality entry data store 260 configured to store quality entries for memory locations that have experienced memory errors. System 200 may also include an error occurrence data store 270 that is organized on a time ordered basis and that is configured to store error occurrence entries derived from error notations. The quality entry data store 260 and the error occurrence data store 270 may be, for example, relatively larger and more persistent memories (e.g., RAMs, disks).

The system 200 may also include a reader logic 275 configured to selectively read the error notation data store 230 and to selectively manipulate the quality entry data store 260 and/or the error occurrence data store 270. By way of illustration, the reader logic 275 may poll the error notation data store 230 to determine whether there is an error notation that has not been read. By way of further illustration, the reader logic 275 may be interrupted when an error notation is deposited in the error notation data store 230. While polling and interrupting are described, those skilled in the art will appreciate that other methods for initiating the reader logic 275 to read the error notation data store 230 can be employed. In one example, the reader logic 275 can perform actions including, but not limited to, creating a new error occurrence entry and storing it in the error occurrence data store 270, updating an error occurrence entry in the error occurrence data store 270, creating a new quality entry and storing it in the quality entry data store 260, and updating a quality entry in the quality entry data store 260.

A quality entry in the quality entry data store 260 may store information including, but not limited to, a memory location identifier (e.g., address, page identifier, DIMM identifier, slot identifier, SIMM identifier, chip identifier), and a quality ranking. Thus, the system 200 may also include a quality ranking logic 280 configured to determine quality rankings for memory locations that have experienced errors. The quality ranking can be stored in a quality entry and thus the quality ranking logic 280 may selectively manipulate quality entries based on information including, but not limited to, quality rankings. The quality ranking logic 280 may rank locations periodically, substantially constantly, and/or in response to a signal (e.g., interrupt) from the error detector logic 210 and/or the error notation data store 230, for example.

Since the quality ranking logic 280 makes quality rankings available for memory locations that have had errors, in one example, the system 200 may also include a memory action logic 285 configured to selectively perform a memory related action based on one or more quality rankings in the quality entry data store 260. The memory related actions can include, but are not limited to, deallocating a unit of memory associated with the memory location, reallocating a unit of memory associated with the memory location, reclaiming a unit of memory associated with the memory location, and generating a signal. By way of illustration, a memory location with a quality ranking that indicates that it may compromise the performance of an application may be deallocated. Similarly, a memory location may have a quality ranking that indicates that it is currently acceptable for a certain application, but that it may be headed for an unacceptable ranking. Thus a signal may be generated that leads to actions like scheduling maintenance for that location, taking that location off line, using that location for lower priority applications, and the like. In one example, the memory related action(s) can be taken substantially in real time.

The quality ranking logic 280 may manipulate the quality entry data store 260 and/or the error entry data store 270. Thus, information concerning groups of memory locations and/or system-wide memory performance may be available. Therefore, in one example, system 200 may include a system action logic 290 configured to selectively perform a system related action based on error occurrence entries and/or quality entries. The system related actions may include, but are not limited to, starting an application, stopping an application, reallocating memory between two or more applications, and generating a signal. By way of illustration, the system action logic 290 may analyze sets of quality entries and determine that various related areas of memory are degrading. This may indicate a local heat or electromagnetic interference problem, for example. Thus, substantially in real time, the system action logic 290 may deallocate that area of memory and reallocate a different area of memory. Then, a signal may be generated that prompts an engineer to investigate the suspect area. By way of further illustration, the system action logic 290 may determine that a set of memory locations employed by a certain application have been experiencing errors since that application has been running. Therefore, the system action logic 290 may determine to halt that application.

The memory error ranking system 200 may benefit from having substantially all memory locations accessed to facilitate generating more comprehensive quality rankings. Thus, in one example, the system 200 may include a memory exercising interface logic 295 configured to program a memory exercising logic (not illustrated). For example, the memory exercising interface logic 295 may transmit exercising parameters like the order in which memory should be analyzed, which areas of memory should be analyzed, the frequency with which certain areas should be exercised, the test patterns that should be used to stress test the memory, and so on.

Figure 3:
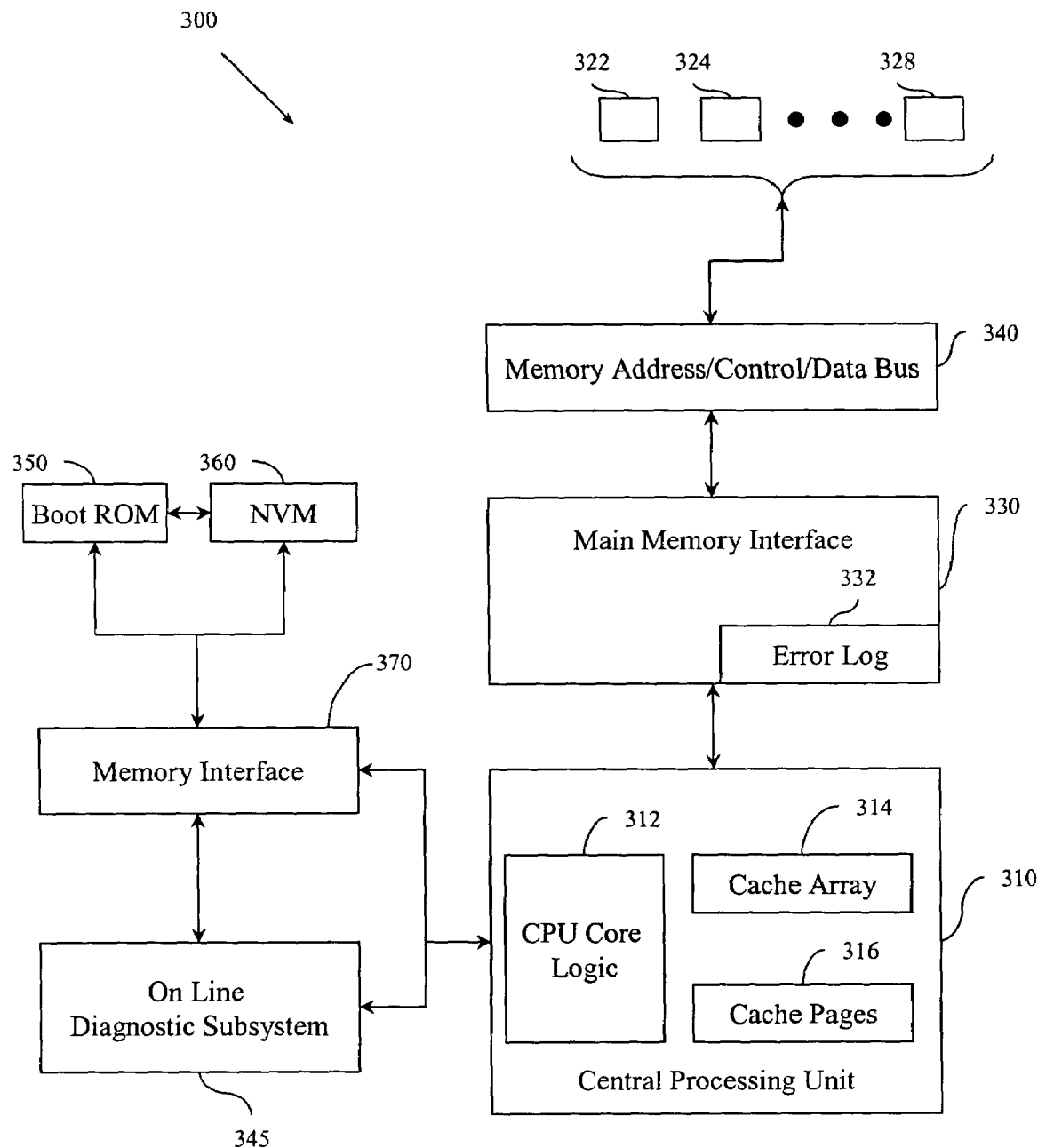
FIG. 3 illustrates an example memory error ranking system.

FIG. 3 illustrates another example memory error ranking system 300. The system 300 includes a central processing unit (CPU) 310 that includes a core logic 312, a cache array 314 and cached pages 316. While a core logic 312, and various caches are illustrated, it is to be appreciated that various processors with various components can be employed in example systems. The CPU 310 may access various memory locations (e.g., locations 322 through 328) through a main memory interface 330. The main memory interface 330 may include an error log 332. In one example, the error log 332 is a volatile memory. While the main memory interface 330 is illustrated external to the CPU 310, in one example, the main memory interface 330 may be located in the CPU 310.

The main memory interface 330 may accept i/o requests from the CPU 310, resolve logical address to physical address translations, access physical memory through a memory bus 340, and so on. The bus 340 may carry, for example, address data, control data, control signals, data, and the like. Responding to the i/o requests may result in memory errors being detected. These errors can be detected by the main memory interface 330 and information concerning the errors (e.g., location, time, type) may be stored in the error log 332.

The system 300 may also include an on line diagnostic subsystem 345 that access the error log 332 (e.g., via CPU 310). While access is illustrated traversing the CPU 310, it is to be appreciated that various access paths may be employed. The online diagnostic subsystem 345 interacts with, for example, a boot ROM 350 and/or a non-volatile memory (NVM) 360 via, for example, a memory interface 370. The NVM 360 could be, for example, an EEPROM or a battery backed SRAM. The on line diagnostic subsystem 345 may be configured to analyze information in the error log 332, update information in the NVM 360, and produce a quality ranking for a memory location that has experienced a memory error. The on line diagnostic subsystem 345 may then generate various signals to the CPU 310 and/or main memory interface 330 concerning memory locations based on the ranking. For example, the on line diagnostic subsystem 345 may signal the main memory interface 330 to redirect i/o requests intended for a memory location with a poor quality ranking to a different location.

The online diagnostic system 345 may be implemented in software, hardware and/or firmware. In one example, the online diagnostic system 345 is implemented in firmware. The firmware can interact with a virtual main memory interface and a persistent, non-volatile memory that maintains data values through power outages, reboots, and the like. Implementing the online diagnostic system 345 in firmware, below the operating system level, can facilitate gaining access to substantially all the memory available to processor 310, including memory that is locked by an application or other component.

Figure 4:
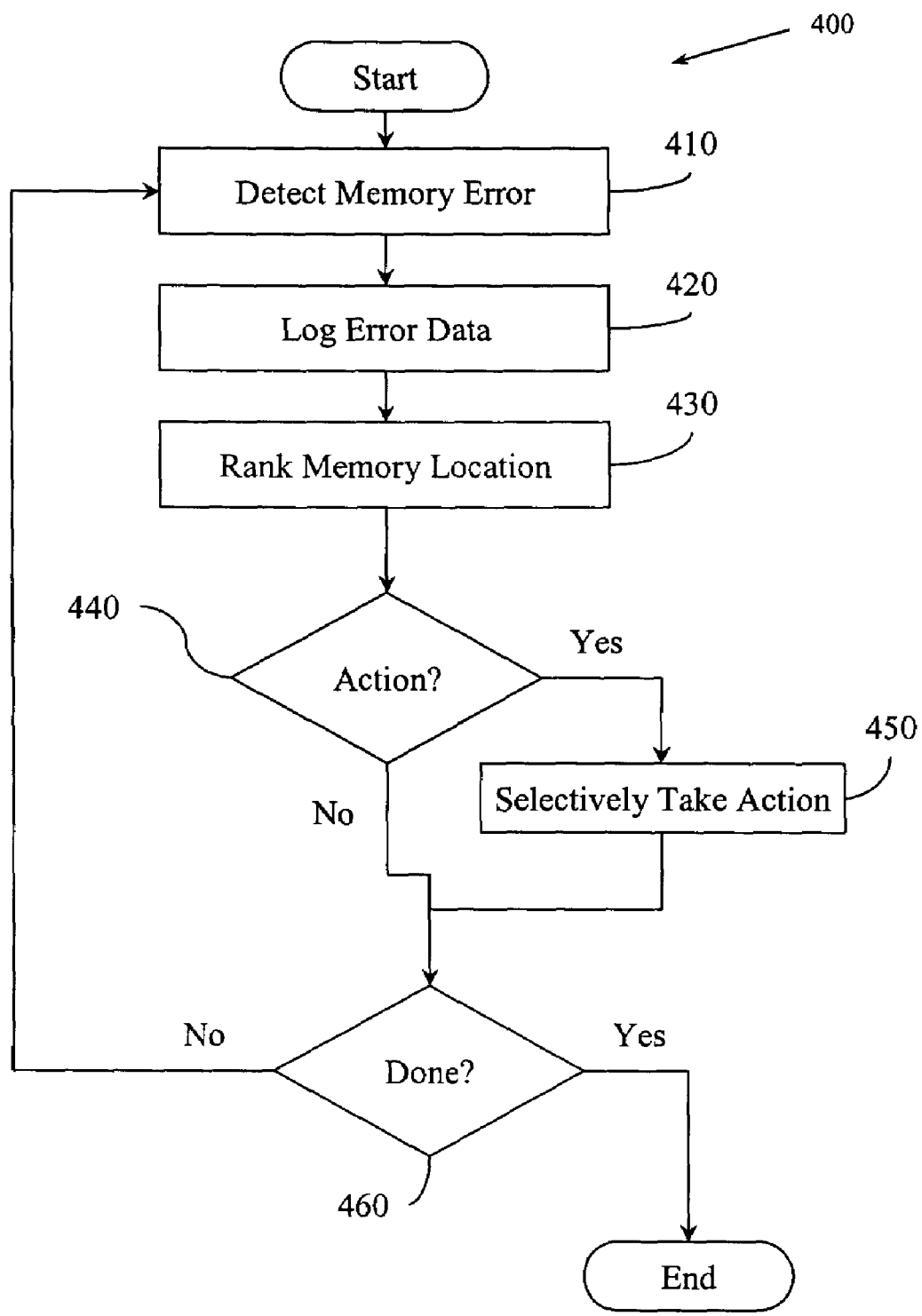
FIG. 4 illustrates an example memory error ranking method.
Figure 5:
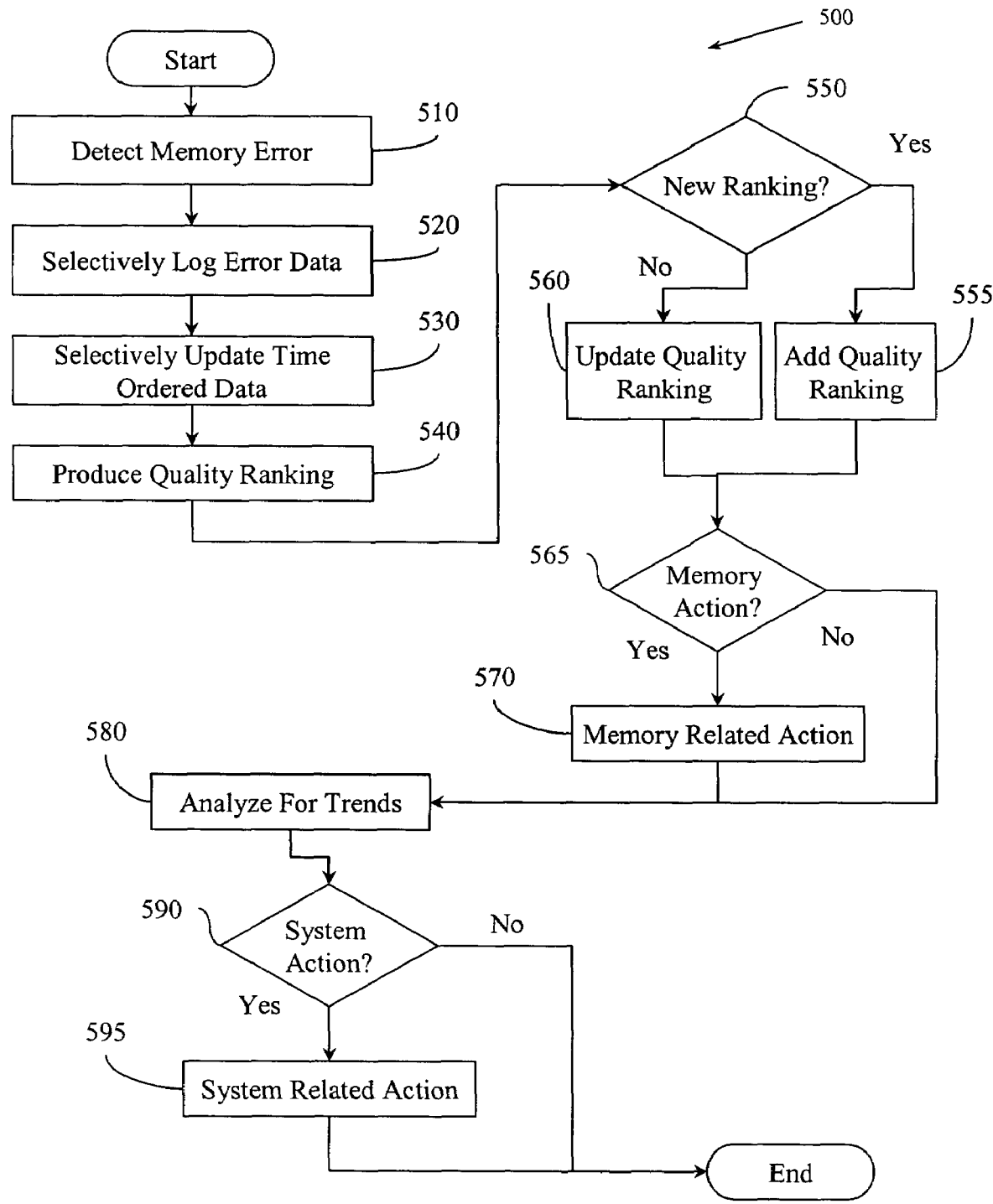
FIG. 5 illustrates an example memory error ranking method.

Example methods may be better appreciated with reference to the flow diagrams of FIGS. 4 and 5. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Furthermore, additional and/or alternative methodologies can employ additional, not illustrated blocks. In one example, methodologies are implemented as processor executable instructions and/or operations stored on a computer-readable medium.

In the flow diagrams, blocks denote "processing blocks" that may be implemented, for example, in software. Additionally and/or alternatively, the processing blocks may represent functions and/or actions performed by functionally equivalent circuits like a digital signal processor (DSP), an ASIC, and the like.

A flow diagram does not depict syntax for any particular programming language, methodology, or style (e.g., procedural, object-oriented). Rather, a flow diagram illustrates functional information one skilled in the art may employ to fabricate circuits, generate software, or use a combination of hardware and software to perform the illustrated processing. It will be appreciated that in some examples, program elements like temporary variables, routine loops, and so on are not shown. It will be further appreciated that electronic and software applications may involve dynamic and flexible processes so that the illustrated blocks can be performed in other sequences that are different from those shown and/or that blocks may be combined or separated into multiple components. It will be appreciated that the processes may be implemented using various programming approaches like machine language, procedural, object oriented and/or artificial intelligence techniques.

FIG. 4 illustrates an example memory error ranking method 400. The method 400 includes, at 410, detecting a memory error associated with a memory location. The error may be, for example, a single bit, multi-bit, or other type of error. At 420, the method includes selectively logging data associated with the error. In one example, where the method 400 may be implemented in firmware and/or in an ASIC, the error data may be consumed substantially immediately and thus the logging action of 420 may be omitted.

The method 400 may also include, at 430, ranking the quality of one or more memory locations based on memory error information. For example, ranking the quality of the memory location may be based on a current memory error associated with a memory location and/or past errors associated with the memory location. Information concerning the past errors may be stored, for example, in an error log or a set of quality ranking data or, in a pure firmware and/or ASIC example, information concerning past errors may be represented by a ranking. In one example the quality ranking occurs substantially in real time as memory errors are detected.

At 440, a determination is made concerning whether to perform an action based on memory location quality rankings. For example, a certain location may have received a quality ranking that indicates that it is unacceptable for continued usage, thus a deallocation may be warranted. If the determination at 440 is Yes, then at 450 the action is performed, otherwise processing proceeds to 460. In one example, the action may be performed substantially in real time as quality rankings are being determined.

While detecting errors at 410, ranking memory locations at 430 and selectively performing actions at 450 are illustrated occurring serially, it is to be appreciated that these actions could occur substantially in parallel. For example, a first thread could be detecting memory errors and populating an error log. A second thread could be substantially constantly ranking memory locations based on data found in the error log. Alternatively, the second thread could update the memory quality rankings on a signal (e.g., interrupt) from the first thread. Similarly, a third thread could be substantially constantly monitoring and/or analyzing memory rankings to determine whether to take an action. Alternatively, the third thread could make an action determination in response to receiving a signal from the second thread that a quality ranking had changed. While three threads are described, it is to be appreciated that a greater and/or lesser number of threads could be employed.

FIG. 5 illustrates another example error ranking method 500. The method 500 may include, at 510, detecting a memory error associated with a memory location. The errors that may be detected at 510 include, but are not limited to, a single bit error, a multi-bit error, a recurring error, an address/control parity error, and the like. Once an error has been detected, the method 500 may include, at 520, selectively logging an error data associated with the memory error. The error data may include, but is not limited to, an error time, an error location, and an error type.

In one example, the method 500 may then include, at 530, selectively adding an error notation to a time-ordered set of data where the error notation is derived from the error data. For example, since the time-ordered set of data may not be concerned with actual time, but only the order of events, the error notation may include a memory location and a memory type, but omit a memory time.

The method 500 may also include, at 540, producing a quality ranking for one or more memory locations. In one example, the quality ranking is generated for the memory location that just experienced a memory error. In another example, quality rankings may be generated for one or more memory locations that had previously experienced memory errors. Thus, the ranking produced at 540 may be based on data including, but not limited to, error data, error notations in the time ordered data, and previous quality ranking data.

The method 500 may also include, at 550, making a determination whether a new memory quality ranking has been produced. For example, a memory location may have experienced its first memory error and thus there may be no memory quality ranking for it. Conversely, a memory location may have experienced many memory errors and thus may have a stored quality ranking. Thus, at 550, a determination is made whether this is a new quality ranking (e.g., first ranking for a location). If the determination is Yes, then at 555, a quality ranking can be added to the quality ranking data. If the determination is No, then at 560, quality ranking data can be updated. The quality ranking data can include information concerning, for example, the type and frequency of memory errors detected for a memory location.

The method 500 may also include, at 565, determining whether to take a memory related action. If the determination at 565 is Yes, then at 570 a memory related action can be taken. The determination at 565 can be based, at least in part, on quality ranking data. Memory related actions can include, but are not limited to, deallocating a unit of memory associated with a memory location, reallocating a unit of memory associated with a memory location, reclaiming a unit of memory associated with a memory location, and generating a signal.

The method 500 may also include, at 580, analyzing data like quality ranking data, time ordered data, error notations, and the like. The analysis at 580 may identify, for example, a trend associated with a memory location. The trend may indicate, for example, that a memory location is becoming more prone to memory errors. This may make the memory location a candidate for deallocating, maintenance, and the like. Thus, based on the analysis and identified trends, at 590, the method 500 may determine whether to take a system action. If the determination at 590 is Yes, then at 595 a system related action may be taken (e.g., start application, stop allocation, schedule maintenance, generate signal).

The method 500 may benefit from being able to exercise all or substantially all the memory associated with a system. Some memory accessible by a processor may be unavailable to application level memory testers. Thus, when the method 500 is implemented in, for example, firmware and/or at or below the operating system level, then substantially all memory accessible by a processor associated with method 500 may be available for exercising (e.g., performing repeated i/o operations). Therefore, in one example, method 500 may include invoking a memory exercising process and/or configuring the memory exercising process.

While FIG. 5 illustrates various actions occurring in serial, it is to be appreciated that various actions illustrated in FIG. 5 could occur substantially in parallel. By way of illustration, a first process could detect and log memory errors, a second process could rank memory, a third process could make memory related action decisions, and a fourth process could make system related action decisions. While four processes are described, it is to be appreciated that a greater and/or lesser number of processes could be employed and that lightweight processes, regular processes, threads, and other approaches could be employed.

In one example, a computer-readable medium may store processor executable instructions operable to perform a method that includes, detecting a memory error, logging a memory error, ranking memory quality, and selectively taking action(s) based on the memory quality ranking. While the above method is described being stored on a computer-readable medium, it is to be appreciated that other example methods and systems described herein can also be stored on a computer-readable medium.

Figure 6:
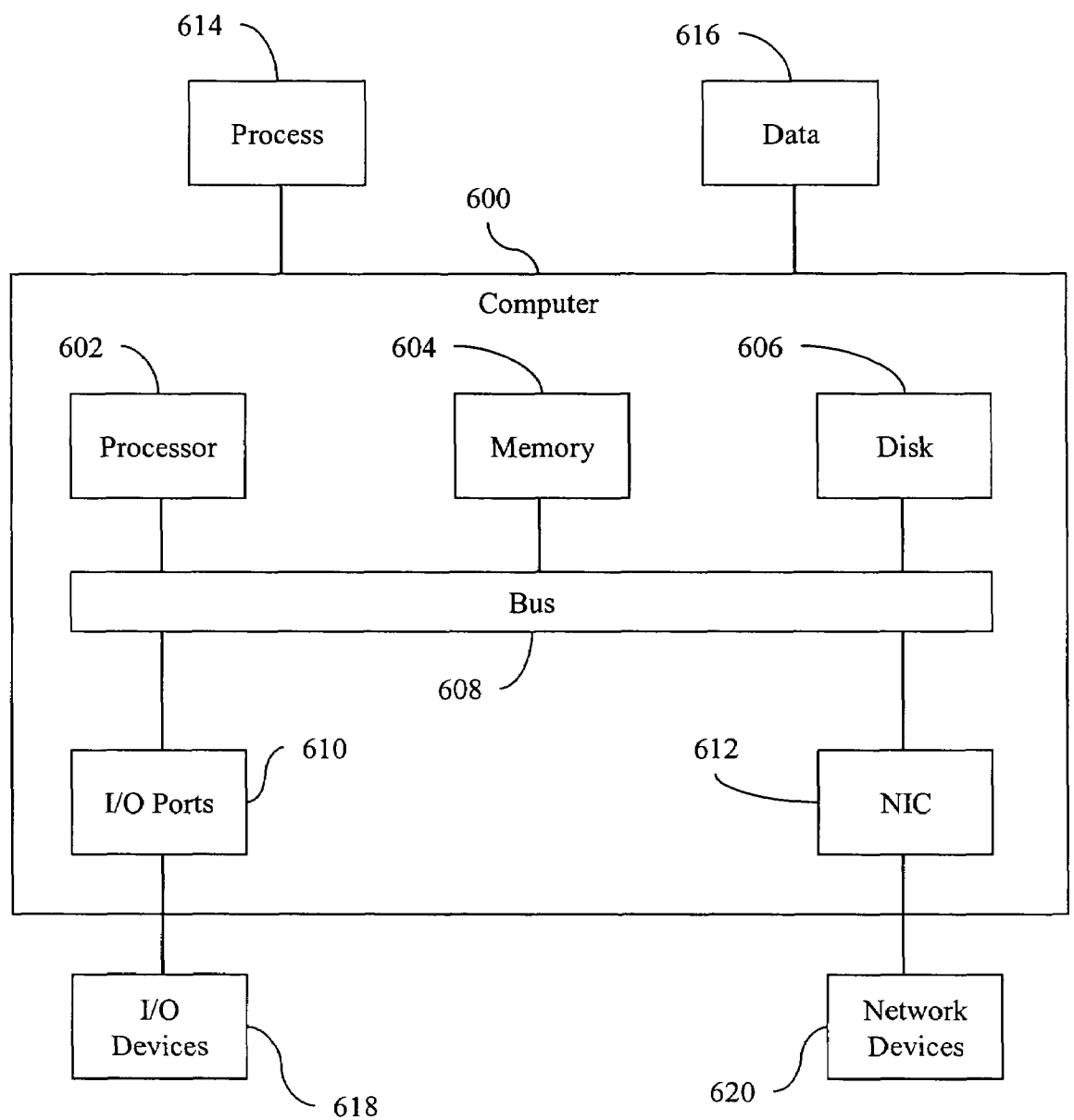
FIG. 6 illustrates an example computing environment in which example memory error ranking systems and methods can operate.

FIG. 6 illustrates a computer 600 that includes a processor 602, a memory 604, a disk 606, input/output ports 610, and a network interface 612 operably connected by a bus 608. Executable components of the systems described herein may be located on a computer like computer 600. Similarly, computer executable methods described herein may be performed on a computer like computer 600. It is to be appreciated that other computers may also be employed with the systems and methods described herein.

The processor 602 can be a variety of various processors including dual microprocessor and other multi-processor architectures. The memory 604 can include volatile memory and/or non-volatile memory. The non-volatile memory can include, but is not limited to, read only memory (ROM), programmable read only memory (PROM), electrically programmable read only memory (EPROM), electrically erasable programmable read only memory (EEPROM), and the like, Volatile memory can include, for example, random access memory (RAM), synchronous RAM (SRAM), dynamic RAM (DRAM), synchronous DRAM (SDRAM), double data rate SDRAM (DDR SDRAM), and direct RAM bus RAM (DRRAM). The disk 606 can include, but is not limited to, devices like a magnetic disk drive, a floppy disk drive, a tape drive, a Zip drive, a flash memory card, and/or a memory stick. Furthermore, the disk 606 can include optical drives like, a compact disc ROM (CD-ROM), a CD recordable drive (CD-R drive), a CD rewriteable drive (CD-RW drive) and/or a digital versatile ROM drive (DVD ROM). The memory 604 can store processes 614 and/or data 616, for example. The disk 606 and/or memory 604 can store an operating system that controls and allocates resources of the computer 600.

The bus 608 can be a single internal bus interconnect architecture and/or other bus architectures. The bus 608 can be of a variety of types including, but not limited to, a memory bus or memory controller, a peripheral bus or external bus, and/or a local bus. The local bus can be of varieties including, but not limited to, an industrial standard architecture (ISA) bus, a microchannel architecture (MSA) bus, an extended ISA (EISA) bus, a peripheral component interconnect (PCI) bus, a universal serial (USB) bus, and a small computer systems interface (SCSI) bus.

The computer 600 interacts with input/output devices 618 via input/output ports 610. Input/output devices 618 can include, but are not limited to, a keyboard, a microphone, a pointing and selection device, cameras, video cards, displays, and the like. The input/output ports 610 can include but are not limited to, serial ports, parallel ports, and USB ports.

The computer 600 can operate in a network environment and thus is connected to network devices 620 by a network interface (NIC) 612. Through the network devices 620, the computer 600 may interact with a network. Through the network, the computer 600 may be logically connected to remote computers. The networks with which the computer 600 may interact include, but are not limited to, a local area network (LAN), a wide area network (WAN), and other networks. The network interface 612 can connect to LAN technologies including, but not limited to, fiber distributed data interface (FDDI), copper distributed data interface (CDDI), Ethernet/IEEE 802.3, token ring/IEEE 802.5, wireless/IEEE 802.11, Bluetooth, and the like. Similarly, the network interface 612 can connect to WAN technologies including, but not limited to, point to point links, circuit switching networks like integrated services digital networks (ISDN), packet switching networks, and digital subscriber lines (DSL).

Figure 7:
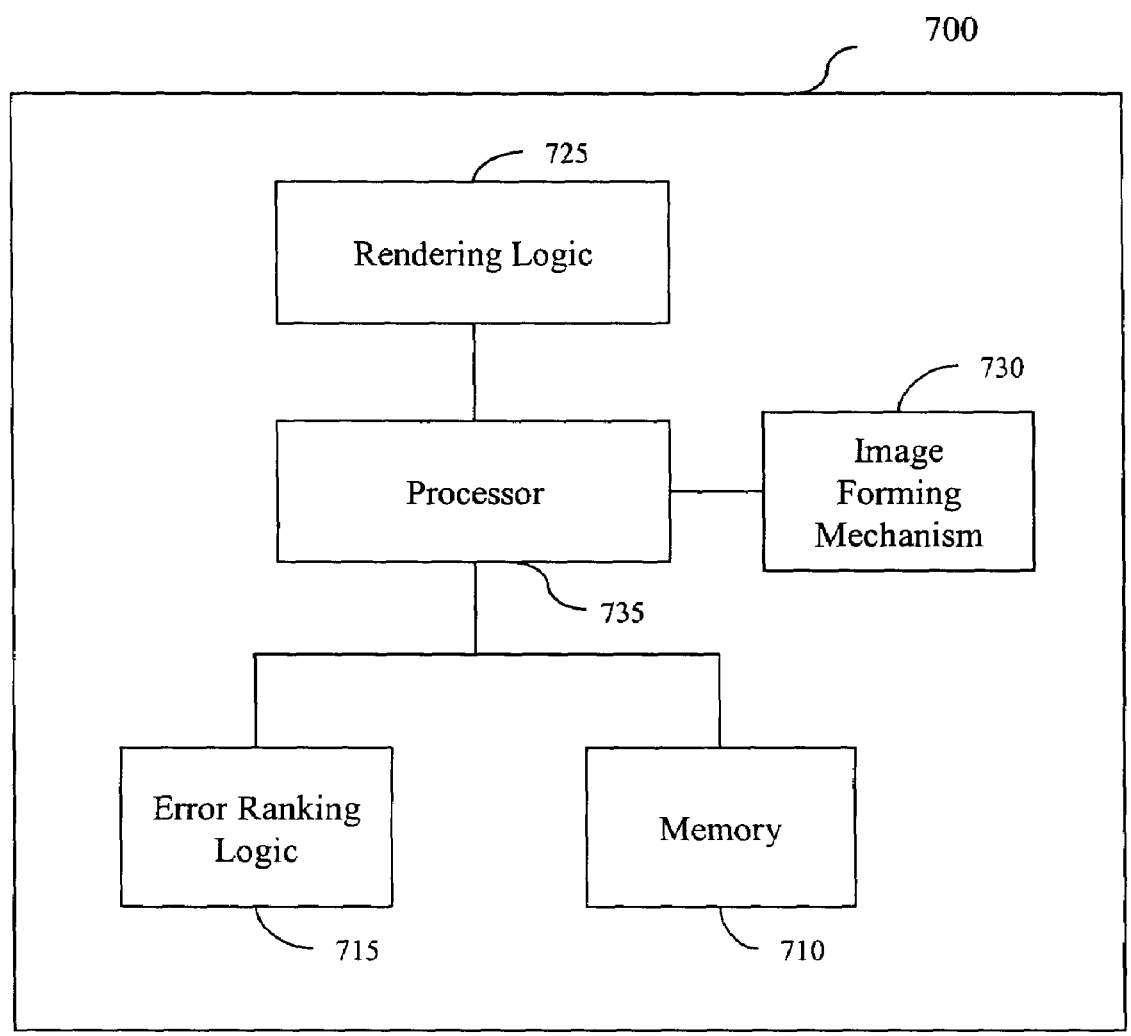
FIG. 7 illustrates an example image forming device in which example memory error ranking systems and methods can operate.

FIG. 7 illustrates an example image forming device 700 on which the example memory error ranking systems and methods may be implemented. The image forming device 700 may include a memory 710 configured to store print data, for example, or to be used more generally for image processing. The image forming device 700 may include an error ranking logic 715 that can analyze the quality of memory locations in memory 710. In one example the analysis is performed substantially in real time.

The image forming device 700 may receive print data to be rendered. Thus, the image forming device 700 may include a rendering logic 725 configured to generate a printer-ready image from print data. Rendering varies based on the format of the data involved and the type of imaging device. In general, the rendering logic 725 converts high-level data into a graphical image for display or printing (e.g., the print-ready image). For example, one form is ray-tracing that takes a mathematical model of a three-dimensional object or scene and converts it into a bitmap image. Another example is the process of converting HTML into an image for display/printing. It is to be appreciated that the image forming device 700 may receive printer-ready data that does not need to be rendered and thus the rendering logic 725 may not appear in some image forming devices.

The image forming device 700 may also include an image forming mechanism 730 configured to generate an image onto print media from the print-ready image. The image forming mechanism 730 may vary based on the type of the imaging device 700 and may include a laser imaging mechanism, other toner-based imaging mechanisms, an ink jet mechanism, digital imaging mechanism, or other imaging reproduction engine. A processor 735 may be included that is implemented with logic to control the operation of the image-forming device 700. In one example, the processor 735 includes logic that is capable of executing Java instructions. Other components of the image forming device 700 are not described herein but may include media handling and storage mechanisms, sensors, controllers, and other components involved in the imaging process.

While the systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on employed in memory error ranking. Additional advantages and modifications will readily appear to those skilled in the art. Therefore, the invention, in its broader aspects, is not limited to the specific details, the representative apparatus, and illustrative examples shown and described. Accordingly, departures may be made from such details without departing from the spirit or scope of the applicants' general inventive concept. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A system, comprising:
    an error detector logic configured to detect a memory error associated with a memory location in a computing device; and
    a ranking logic configured to determine a quality ranking for the memory location based, at least in part, on one or more of, a current memory error associated with the memory location as detected by the error detector logic, and one or more past errors associated with the memory location as detected by the error detector logic;
    the ranking logic being configured to store the quality ranking in a data store;
    the error detector logic and the ranking logic being located in the computing device.

2. The system of claim 1, comprising:
    a memory action logic configured to perform one or more memory related actions based, at least in part, on the quality ranking.

3. The system of claim 2, where the memory related actions comprise one or more of, deallocating a unit of memory associated with the memory location, reallocating a unit of memory associated with the memory location, reclaiming a unit of memory associated with the memory location, and generating a signal.

4. A system, comprising:
    an error notation data store configured to store one or more error notations;
    a quality entry data store configured to store one or more quality entries for one or more memory locations that have experienced one or more memory errors;
    an error occurrence data store, organized on a time ordered basis, configured to store an error occurrence entry derived from an error notation;

an error detector logic configured to detect a memory error associated with a memory location and to store in the error notation data store an error notation related to the memory error;

a reader logic configured to selectively read the error notation data store and to selectively manipulate the quality entry data store and the error occurrence data store; and a quality ranking logic configured to determine a quality ranking for the memory location and to selectively manipulate a quality entry associated with the memory location based, at least in part, on one or more of, a quality entry in the quality entry data store, and an error occurrence entry in the error occurrence data store.

5. The system of claim 4, comprising:

a memory action logic configured to selectively perform a memory related action based, at least in part, on one or more quality entries in the quality entry data store.

6. The system of claim 5, where the memory related action comprises one or more of, deallocating a unit of memory associated with the memory location, reallocating a unit of memory associated with the memory location, reclaiming a unit of memory associated with the memory location, and generating a signal.

7. The system of claim 5, comprising:

a system action logic configured to selectively perform a system related action based, at least in part, on one or more of, one or more error occurrence entries, and one or more quality entries.

8. The system of claim 7, where the system related actions comprise one or more of, starting an application, stopping an application, reallocating memory between two or more applications, and generating a signal.

9. The system of claim 4, where an error notation includes a memory location identifier, a memory error type, and a memory error time.

10. The system of claim 9, where the memory error type is one of, a single bit error, a multi-bit error, and an address/control parity error.

11. The system of claim 4, where a quality entry for a memory location includes one or more of, a page identifier, a DIMM identifier, a slot identifier, a SIMM identifier, and a chip identifier.

12. The system of claim 4, where the error detector logic is located in a main memory interface.

13. The system of claim 4, where the error detector logic is located in a central processing unit.

14. The system of claim 4, where the reader logic selectively manipulating the quality entry data store and the error occurrence data store comprises one or more of, creating a new error occurrence entry and storing it in the error occurrence data store, updating an error occurrence entry in the error occurrence data store, creating a new quality entry and storing it in the quality entry data store, and updating a quality entry in the quality entry data store.

15. The system of claim 4, comprising:

a memory exercising interface logic configured to program a memory exercising logic.

16. A method, comprising:

detecting a memory error associated with a memory location in a computing device; and ranking a quality of the memory location based, at least in part, on a current memory error associated with the memory location or one or more past errors associated with the memory location;

the method being performable in the computing device.

17. The method of claim 16, comprising:

selectively performing a memory related action based, at least in part, on the quality of the memory location.

18. The method of claim 17, where the memory related action is performed substantially in real time as the ranking is determined.

19. The method of claim 16, where the ranking is performed substantially in real time as the memory error is detected.

20. A method, comprising:

detecting a memory error associated with a memory location in a computing device;

selectively logging error data associated with the memory error;

selectively adding an error notation to a time-ordered data set based, at least in part, on the error data;

producing a quality ranking associated with the memory location based, at least in part, on one or more of, the error data, one or more error notations in the time-ordered data set, and one or more quality rankings in a quality data set;

selectively manipulating a quality ranking based, at least in part, on a previous quality ranking; and selectively performing a memory related action based, at least in part, on one or more quality rankings;

the method being preformed in the computing device.

21. The method of claim 20, where a memory related action comprises one or more of, deallocating a unit of memory associated with the memory location, reallocating a unit of memory associated with the memory location, reclaiming a unit of memory associated with the memory location, and generating a signal.

22. The method of claim 20, where the quality ranking associated with the memory location is based on one or more of, a type of the memory error detected, and a frequency of memory errors detected for the memory location.

23. The method of claim 20, comprising:

identifying a trend associated with one or more memory locations by analyzing one or more of, one or more error notations in the time-ordered data set, and one or more quality rankings in the quality data set; and performing one or more of, a memory related action, and a system related action based, at least in part, on the trend.

24. The method of claim 20, comprising:

invoking a memory exercising process.

25. The method of claim 24, comprising:

configuring the memory exercising process.

26. The method of claim 20, where the memory error is one or more of, a single bit error, a multi-bit error, a recurring error, and an address/control parity error.

27. A computer, comprising:

a processor;

a memory operably connected to the processor, where the processor is to perform an input/output operation to the memory;

an error detector logic to detect memory errors associated with a memory location in the memory; and a ranking logic to rank a quality of the memory location based, at least in part, on the memory errors detected by the error detector logic;

where the ranking logic is to store the quality of the memory location in a data store.

28. A computer-readable medium storing processor executable instructions operable to perform a method, the method comprising:

detecting a memory error associated with a memory location; and ranking the quality of the memory location based, at least in part, on one or more of, a current memory error associated with the memory location as detected by the error detector logic, and one or more past errors associated with the memory location as detected by the error detector logic.

29. An image forming device, comprising:

a processor;

a memory operably connected to the processor, where the processor is to perform an input/output operation to the memory;

an error detector logic to detect memory errors associated with a memory location in the memory; and a ranking logic to determine a quality ranking for the memory location based, at least in part, on the memory errors detected by the error detector logic.

\* \* \* \* \*

UNITED STATES PATENT AND TRADEMARK OFFICE
CERTIFICATE OF CORRECTION

PATENT NO. : 7,493,534 B2
APPLICATION NO. : 10/652098
DATED : February 17, 2009
INVENTOR(S) : Ken Gary Pomaranski et al.

It is certified that error appears in the above-identified patent and that said Letters Patent is hereby corrected as shown below:

In column 14, line 28, in Claim 20, delete "preformed" and insert -- performed --, therefor.

Signed and Sealed this

Second Day of June, 2009

JOHN DOLL
*Acting Director of the United States Patent and Trademark Office*